United States Patent [19]
Goto

[11] Patent Number: 4,611,386
[45] Date of Patent: Sep. 16, 1986

[54] METHOD OF PRODUCING A SEMICONDUCTOR DEVICE

[75] Inventor: Hiroshi Goto, Yokohama, Japan

[73] Assignee: Fujitsu Limited, Kawasaki, Japan

[21] Appl. No.: 564,713

[22] Filed: Dec. 23, 1983

[30] Foreign Application Priority Data

Dec. 27, 1982 [JP] Japan .................................. 57-228400

[51] Int. Cl.[4] ..................... H01L 21/76; H01L 21/308
[52] U.S. Cl. .................................. 29/576 W; 29/571;
29/578; 148/1.5; 148/175; 357/40; 357/49;
357/50; 357/55
[58] Field of Search ...................... 29/571, 578, 576 R,
29/576 W, 580; 148/1.5, 174, 175, 186; 357/23,
24, 33, 34, 35, 40, 41, 42, 43, 47, 49, 48, 50, 55,
59

[56] References Cited

U.S. PATENT DOCUMENTS

| | | | |
|---|---|---|---|
| 4,104,086 | 8/1978 | Bondur et al. | 29/578 X |
| 4,252,582 | 2/1981 | Anantha et al. | 29/576 W X |
| 4,255,207 | 3/1981 | Nicolay et al. | 29/576 W X |
| 4,269,636 | 5/1981 | Rivoli et al. | 29/576 W X |
| 4,376,664 | 3/1983 | Hataishi et al. | 29/571 X |
| 4,391,033 | 7/1983 | Shinozaki | 29/576 W |
| 4,396,460 | 8/1983 | Tamaki et al. | 29/576 W X |
| 4,420,874 | 12/1983 | Funatsu | 29/576 W |
| 4,449,287 | 5/1984 | Maas et al. | 29/576 W X |
| 4,455,740 | 6/1984 | Iwai | 29/576 W X |

FOREIGN PATENT DOCUMENTS

| | | |
|---|---|---|
| 0041776 | 12/1981 | European Pat. Off. . |
| 0048175 | 3/1982 | European Pat. Off. . |
| 0061855 | 10/1982 | European Pat. Off. . |
| 2804500 | 3/1978 | Fed. Rep. of Germany . |
| 3038067 | 4/1981 | Fed. Rep. of Germany . |
| 0044746 | 3/1980 | Japan .................... 29/576 W |
| 0012533 | 1/1982 | Japan .................... 29/576 W |
| 0021340 | 2/1983 | Japan .................... 29/576 W |
| 0044735 | 3/1983 | Japan .................... 29/576 W |
| 0056432 | 4/1983 | Japan .................... 29/576 W |
| 0138049 | 8/1983 | Japan .................... 29/576 W |

Primary Examiner—Brian E. Hearn
Assistant Examiner—David A. Hey
Attorney, Agent, or Firm—Staas & Halsey

[57] ABSTRACT

A method of producing a semiconductor device having an isolation region between elements. Each element is surrounded by a field oxide film, and is isolated by the dielectric isolation structure of a groove filled with an insulating material. The field oxide film is formed by selectively oxidizing an epitaxial layer, and the groove extending through the epitaxial layer and a buried layer is formed after the oxidation of the epitaxial layer. After the surface of the groove is covered with an insulating film, e.g., a thermal oxide film created by oxidizing the surface, the groove is filled with insulating filler material.

17 Claims, 6 Drawing Figures

METHOD OF PRODUCING A SEMICONDUCTOR DEVICE

BACKGROUND OF THE INVENTION

1. Field of the Invention

The present invention relates to a method of producing a semiconductor device, and more particularly to a method of achieving isolation between elements by using a groove filled with an insulating material.

2. Description of the Prior Art

In one prior art semiconductor device of a bipolar transistor, a relatively thick field oxide film surrounds an active region (i.e., a base region and a collector contact region), as illustrated in, for example, FIG. 1 of U.S. Pat. No. 4,376,664. Such a transistor is hereinafter referred as to an oxide-surrounded transistor (OST). In the OST, a field oxide film having a thickness of from 0.4 to 2.0 $\mu$m surrounds the side of the base region. Accordingly, the parasitic capacitance between the base and collector can be decreased as compared with the case where the side of the base region does not come into contact with the field oxide film. The decrease of the parasitic capacitance particularly improves transistor characteristics (e.g., switching speeds).

The above OST, however, is isolated from other elements by means of PN junction isolation. The PN junction constitutes, for example, an N-type epitaxial layer, formed on a P-type semiconductor substrate, and a P-type isolation region, extending into the substrate through the epitaxial layer and surrounding the collector region of the OST. Therefore, the PN junction capacitance between the N-type epitaxial layer and the P-type isolation region is relatively large in proportion to the junction area. Furthermore, the above OST has a collector buried layer formed in the substrate and the epitaxial layer. Since the cylindrical end portion of the buried layer exists in the substrate, the PN junction area between the collector region including the buried layer and the semiconductor substrate is larger than that between a collector region without the buried layer and the substrate. Therefore, the PN junction capacitance increases proportionally to the difference in area. Such a large PN junction capacitance lowers the switching speed of the bipolar transistor.

SUMMARY OF THE INVENTION

An object of the present invention is to provide a method of producing a semiconductor device using the OST structure, wherein the PN junction capacitance is reduced and, thus, reduction of the switching speed is prevented.

Another object of the present invention is to enable more improved isolation, whereby the breakdown voltage is increased.

These and other objects of the present invention are achieved by a method of producing a semiconductor device comprising the step of providing dielectric isolation by forming a groove filled with an insulating material after the formation of a field oxide film for the OST. Namely, according to the present invention, the method of producing the semiconductor device comprises, in order, the steps of: forming a buried layer in a semiconductor substrate; forming an epitaxial layer on the semiconductor substrate; selectively oxidizing the epitaxial layer except portions corresponding to an isolation region and an active region to form an oxide film; forming a groove extending through the buried layer in the portion corresponding to the isolation region; covering the surface of the groove with an insulating film; and filling the groove with a filler material.

BRIEF DESCRIPTION OF THE DRAWINGS

The present invention will be more apparent from the description of the preferred embodiments set forth below with reference to the accompanying drawings, in which.

DESCRIPTION OF THE PREFERRED EMBODIMENTS

Figure 1:
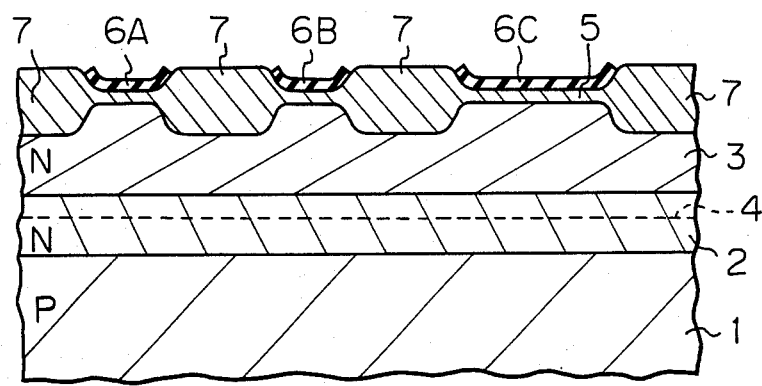
FIGS. 1 through 6 are schematic sectional views of a semiconductor device according to the present invention in various stages of production in accordance with the method of the present invention.

Referring to FIG. 1, a semiconductor substrate 1 of, for example, P-type single crystalline silicon is provided. An $N^+$-type buried layer 2 is preformed in the substrate 1 by diffusing N-type impurities into the entire upper portion of the substrate 1. Then, an $N^-$-type epitaxial layer 3 of silicon is grown on the substrate 1. Upon the epitaxial growth, the N-type impurities in the substrate 1 diffuse into the epitaxial layer 3 to form the final buried layer 2 as illustrated in FIG. 1. The interface of the substrate 1 and the epitaxial layer 3 is indicated by a broken line 4 in the buried layer 2.

A thin silicon dioxide film 5 serving as a buffer film is formed by thermally oxidizing the epitaxial layer 3. A silicon nitride film is formed on the silicon dioxide film 5 by a chemical vapor deposition (CVD) method and first regions of the film are selectively removed by, e.g., a photoetching method, to leave silicon nitride portions 6A, 6B, and 6C for an isolation region, a collector contact region, and a base region, respectively. Using the nitride portions 6A, 6B, and 6C as masks, the epitaxial layer 3 is thermally oxidized to form a field oxide film 7 of silicon dioxide, as shown in FIG. 1. The thickness of the field oxide film 7 is preferably form 0.4 to 2.0 $\mu$m. Such selective oxidation of silicon is referred to as a local oxidation of silicon (LOCOS) process.

Figure 2:
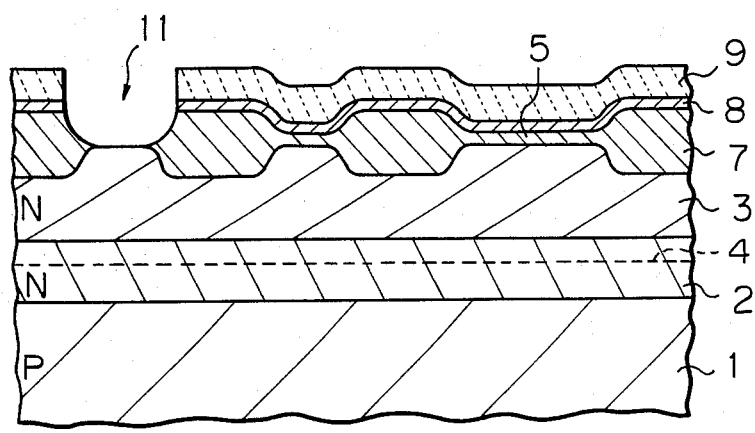

After the silicon nitride portions 6A, 6B, and 6C are removed, another silicon nitride ($Si_3N_4$) film 8 having a thickness of, e.g., from 0.1 to 0.2 $\mu$m is formed on the entire exposed surface by a chemical vapor deposition (CVD) method, as shown in FIG. 2. Subsequently, a phosphosilicate glass (PSG) film 9 having a thickness of, e.g., about 0.5 to 1.0 $\mu$m is formed on the nitride film 8 by a CVD method. Then, a resist film (not shown) is formed on the PSG film 9, exposed, and developed. Using the resist film as a mask, portions of the PSG film 9 and the nitride film 8 are selectively removed by a reactive ion etching (RIE) method using $CHF_3$ gas. At this time, the silicon dioxide is etched but the silicon is not, so that the thin silicon dioxide layer 5 is removed to form a window 11, as shown in FIG. 2. Therefore, the portion of the epitaxial layer 3 corresponding to the isolation region is exposed. It is also possible to carry out the formation of the window 11 by a wet etching method using suitable etchants.

Figure 3:
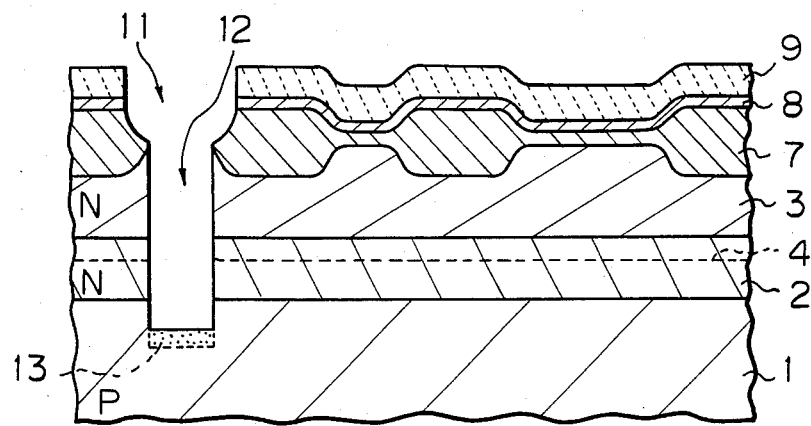

Next, since the silicon in the epitaxial layer 3, the buried layer 2, and the substrate 1 is selectively etched by a reactive ion etching (RIE) method using a mixed gas of $CCl_4$ and $BCl_3$, the exposed portion of the epitaxial layer 3 and the underlying semiconductor substrate 1 are etched to form a U-shaped groove 12, which extends through the buried layer 2, as shown in FIG. 3. It is also possible to form a V-shaped groove instead of the U-shaped groove by an anisotropic etching method using a suitable etchant. It is preferable to form the U-shaped groove because it contributes to making the semiconductor device denser as compared with the V-groove.

The PSG film 9 is removed by a wet etching method. Then, in order to prevent the generation of an undesirable n-type channel a P+-type channel-cut layer 13 (FIG. 3) is formed in the p-type silicon substrate 1 at the bottom of the U-groove by introducing P-type impurities (e.g., boron ions) through the window 11 by an ion-implantation method at an energy of 40 keV and a dose of $1 \times 10^{13}$ ions/cm$^2$. The channel-cut layer 13 does not come into contact with the buried layer 2, since the groove extends through the buried layer 2. The formation of the channel-cut layer 13 can contribute toward improvement of the breakdown voltage.

In some cases, it is unnecessary to form the channel-cut layer. It is possible to remove the PSG film 9 after the ion-implantation step, if the PSG film is not removed prior thereto. It is also possible to use a silicon dioxide film instead of the PSG film. Furthermore, it is possible to carry out formations of the window 11 and the groove 12 without the PSG film. In this case, the ratio of the etching rate of Si$_3$N$_4$ to that of Si should be 1:25 or more.

Figure 4:
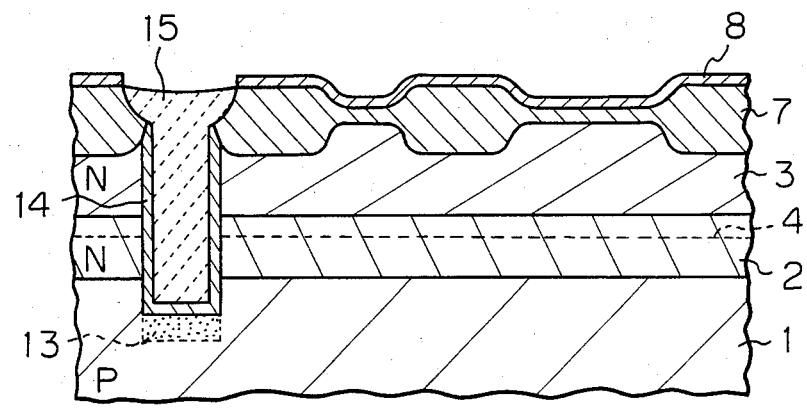

Next, the surface of the U-groove 12, i.e., the exposed surface of the epitaxial layer 3, the buried layer 2 and the substrate 1, is thermally oxidized to form an oxide film 14 of silicon dioxide, as shown in FIG. 4. The U-groove with the oxide film 14 is filled with a filler material 15 e.g., undoped polycrystalline silicon. It is also possible to use borosilicate glass, silicon resin, and aluminum oxide, as the filler material. However, taking thermal expansivity into consideration, polycrystalline silicon is the best material.

In this case, when the polycrystalline silicon is formed so as to fill the U-shaped groove by a CVD method, it is deposited on the silicon nitride film 8. The excessive polycrystalline silicon on the nitride film 8 is removed by polishing. In this polishing step, the nitride film 8 serves as a stopper and almost all of the polycrystalline silicon on the nitride film 8 can be removed. If small portions of the polycrystalline silicon remain at corners of the recesses, they can be removed by a wet etching method using a solution of potassium hydroxide (KOH). Thus, the surface of the obtained polycrystalline silicon filler 15 can be made flat with the field oxide film 7, as shown in FIG. 4.

Figure 5:
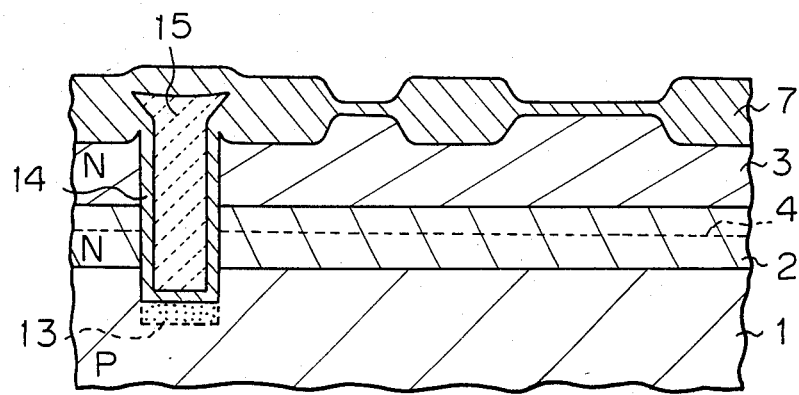

It is preferable to thermally oxidize the exposed surface of the polycrystalline filler 15 to form an oxide portion combining with the field oxide film 7, as shown in FIG. 5, since the resistivity of silicon dioxide is higher than that of polycrystalline silicon. At this time, the nitride film 8 prevents oxygen from penetrating therethrough. Then, the nitride film 8 is removed by etching.

Figure 6:
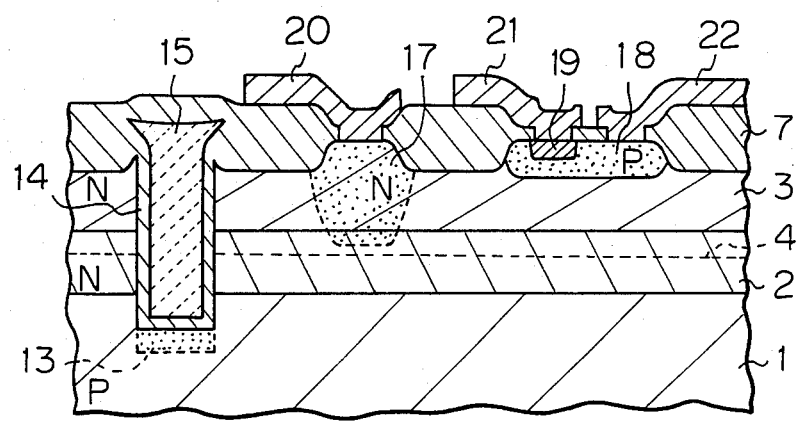

Thereafter, an N+-type collector contact region 17, a P-type base region 18, and an N-type emitter region 19 are formed in a conventional production manner, as shown in FIG. 6. For example, the collector contact region 17 is formed by introducing N-type impurities into the epitaxial layer 3 by an ion-implantation method and by diffusing them by an annealing method. It is preferable to bring the collector contact region 17 into contact with the buried layer 2, as shown in FIG. 6. The base region 18 is formed by ion-implantation and annealing, so as to be surrounded with the field oxide film 7. The emitter region 19 is formed in the base region 18 by ion-implantation and annealing. A collector electrode 20, an emitter electrode 21, and a base electrode 22 are formed in a conventional manner. Thus, a semiconductor device having the OST structure is obtained.

Since the obtained semiconductor device has a dielectric isolation structure instead of a PN junction isolation structure and a flat PN junction interface of the semiconductor substrate and the buried layer, the PN junction capacitance of the obtained device is smaller than that of the OST of the prior art. Therefore, the switching speed can be increased as compared with the OST of the prior art.

It will be obvious that the present invention is not restricted to the above-mentioned embodiments and that many variations are possible for those skilled in the art without departing from the scope of the present invention. For example, the thin oxide film 5 under the nitride portions 6A, 6B and 6C is not always necessary. In a case where the thin oxide film 5 is not used, the collector contact region 17 can be formed by implanting impurites through the nitride portion 6B by using a resist layer as a mask. After an annealing step and a removing step of the nitirde portions 6B and 6c, the silicon surface of the active region should be oxidized to form a thin oxide film 5, so as to passivate the surface of the active region. Then, ion-implantation for forming a base region or other regions should be performed through the thin oxide film 5. Furthermore, the thermal oxide film 14 can be replaced by a CVD oxide film, a plasma CVD film or other kinds of oxide film, and it can be also replaced by a direct nitrided silicon film, a CVD nitride film, a plasma CVD nitride film, a CVD oxinitride film or a plasma CVD oxinitride film. The thermal oxide film 14 may be replaced any type of a dielectric film, e.g., a CVD phosphosilicate glass film, or a plasma CVD phosphosilicate glass film.

I claim:

1. A method of producing a semiconductor device having a semiconductor substrate, comprising the steps of:
   (a) forming a buried layer in the semiconductor substrate;
   (b) forming an epitaxial layer on the semiconductor substrate;
   (c) selectively oxidizing the epitaxial layer, except portions in which an isolation region and active regions are to be formed, to form a field oxide film;
   (d) forming, after said oxidizing step, a groove extending through the epitaxial layer and the buried layer in the portion in which the isolation region is to be formed, a side wall of the groove being aligned with an edge of the oxide film;
   (e) covering the surface of the groove with an insulating film; and
   (f) filling the groove with a filler material.

2. A method according to claim 1, wherein said step (c) includes forming a field oxide film having a thickness of from 0.4 to 2.0 μm.

3. A method according to claim 1, wherein said step (d) includes forming a groove having a U-shape in section.

4. A method according to claim 3, wherein said step (d) includes forming said U-shaped groove by selectively removing the epitaxial layer and the semiconductor substrate by reactive ion etching.

5. A method according to claim 1, wherein said step (d) includes forming a groove having a V-shape in section.

6. A method according to claim 5, wherein said step (d) includes forming said V-shaped groove by selectively removing the epitaxial layer and the semiconductor substrate by anisotropic etching.

7. A method according to claim 1, wherein said step (e) includes forming said insulating film from one film selected from the group consisting of a thermal oxide film, a CVD oxide film, a plasma CVD oxide film, a direct nitrided silicon film, a CVD nitride film, a plasma CVD nitride film, a CVD oxinitride film, a plasma CVD oxinitride film, a CVD phosphosilicate glass film, and a plasma CVD phosphosilicate glass film.

8. A method according to claim 1, wherein said step (e) includes oxidizing the surface of the groove to form a thermal oxide film on the surface.

9. A method according to claim 1, wherein said step (f) includes filling said groove with a filler material selected from the group consisting of polycrystalline silicon, silicon dioxide, phosphosilicide glass, borosilicate glass, silicon resin, and aluminum oxide.

10. A method according to claim 9, wherein said filler material is polycrystalline silicon, and said step (f) includes oxidizing the surface of the polycrystalline silicon within the groove.

11. A method according to claim 1, further comprising the step of forming a channel-cut layer at the bottom of the groove, after the step of forming the groove.

12. A method of producing a semiconductor device having a semiconductor substrate, comprising the sequential steps of:
(a) forming a buried layer in the semiconductor substrate;
(b) forming an epitaxial layer on the semiconductor substrate;
(c) selectively oxidizing the epitaxial layer, except portions in which an isolation region and an active region are to be formed, to form a field oxide layer;
(d) forming a nitride film on the exposed surface;
(e) forming a window in the nitride film at a portion corresponding to the isolation region;
(f) forming a U-shaped groove extending through the epitaxial layer and the buried layer within the window, a side wall of the groove being aligned with an edge of the oxide film;
(g) forming a channel-cut layer in the semiconductor substrate at the bottom of the U-shaped groove;
(h) oxidizing the surface of the U-shaped groove;
(i) filling the U-shaped groove with polycrystalline silicon; and
(j) oxidizing the surface of the polycrystalline silicon in the U-shaped groove to form an oxide film joining with the field oxide film.

13. A method of producing a semiconductor device having a semiconductor substrate, comprising the steps of:
(a) forming a buried layer in the semiconductor substrate;
(b) forming an epitaxial layer having first regions, an isolation region, and active regions on the semiconductor substrate;
(c) selectively oxidizing the first regions of the epitaxial layer to form a field oxide film;
(d) forming a groove extending through the isolation region of the epitaxial layer and the buried layer after the oxidizing step;
(e) forming an insulating film on the surface of the groove; and
(f) filling the groove with a filler material.

14. A method according to claim 13, wherein said step (d) includes forming a groove having U-shape in section.

15. A method according to claim 14, wherein said step (e) includes forming said insulating film by oxidizing the surface of the U-shaped groove.

16. A method according to claim 13, wherein said step (e) includes forming said insulating film from a film selected from a group consisting of a thermal oxide film, a CVD oxide film, a plasma CVD oxide film, a direct nitrided silicon film, A CVD nitride film, a plasma CVD nitride film, a CVD oxinitride film, a plasma CVD oxinitride film, a CVD phosphosilicate glass gilm and a plasma CVD phosposilicate glass film.

17. A method according to claim 13, wherein said step (f) includes filling said groove with a filler material selected from a group consisting of polycrystalline silicon, silicon dioxide, phosphosilicide glass, borosilicate glass, silicon resin, and aluminum oxide.

* * * * *

UNITED STATES PATENT AND TRADEMARK OFFICE
CERTIFICATE OF CORRECTION

PATENT NO. : 4,611,386

DATED : September 16, 1986

INVENTOR(S) : Goto

It is certified that error appears in the above-identified patent and that said Letters Patent is hereby corrected as shown below:

Col. 1, line 41, "betewen" should be --between--.

Col. 4, line 26, "nitirde" should be --nitride--;

line 34, "nitrided" should be --nitride--.

Col. 6, line 37, "A" should be --a--;

line 39, "gilm" should be --film--.

Signed and Sealed this

Twenty-third Day of December, 1986

Attest:

DONALD J. QUIGG

Attesting Officer     Commissioner of Patents and Trademarks